United States Patent [19]

Krautschneider et al.

[11] Patent Number: 5,308,783
[45] Date of Patent: May 3, 1994

[54] PROCESS FOR THE MANUFACTURE OF A HIGH DENSITY CELL ARRAY OF GAIN MEMORY CELLS

[75] Inventors: Wolfgang H. Krautschneider, Burlington, Vt.; Werner M. Klingenstein, Kirchheim, Fed. Rep. of Germany

[73] Assignee: Siemens Aktiengesellschaft, Munich, Fed. Rep. of Germany

[21] Appl. No.: 991,776

[22] Filed: Dec. 16, 1992

[51] Int. Cl.$^5$ .................................... H01L 21/70
[52] U.S. Cl. .................................... 437/52; 437/40; 437/47; 437/60; 437/200; 437/904; 437/915
[58] Field of Search ................ 437/40, 47, 48, 52, 437/60, 904, 915, 200

[56] References Cited

U.S. PATENT DOCUMENTS

| | | | |
|---|---|---|---|
| 4,416,404 | 10/1984 | Wang et al. | 437/904 |
| 4,432,073 | 2/1984 | Masuoka | 365/182 |
| 4,543,595 | 9/1985 | Vora | 357/71 |
| 4,631,705 | 12/1986 | Honda | 257/904 |
| 4,654,825 | 3/1987 | Rinerson | 365/185 |
| 4,914,740 | 4/1990 | Kenney | 357/236 |
| 5,021,849 | 6/1991 | Pfiester et al. | 357/23.5 |

*Primary Examiner*—Tom Thomas
*Attorney, Agent, or Firm*—Adel A. Ahmed

[57] ABSTRACT

A multistep process is disclosed that provides an economical process for making a gain memory cell array using self-aligned techniques; that provides an integrated diode in the gate stack of the storage transistor; that provides a buried $V_{DD}$ line to connect the drains of the storage transistors to the power supply; and that provides a buried strap to connect the integrated diode to the source region of the storage transistor.

6 Claims, 4 Drawing Sheets

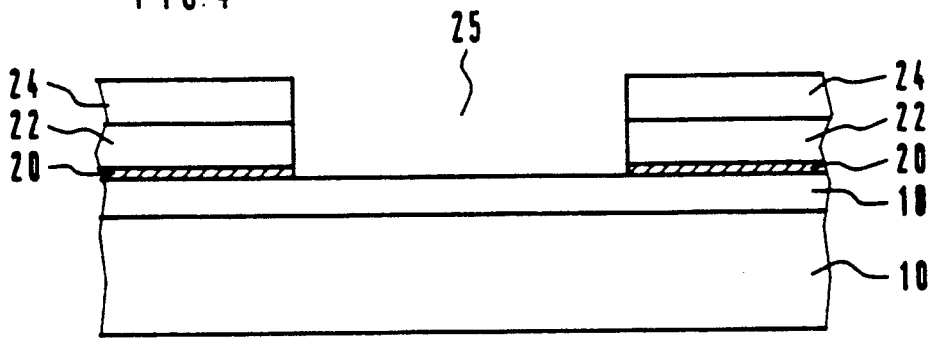
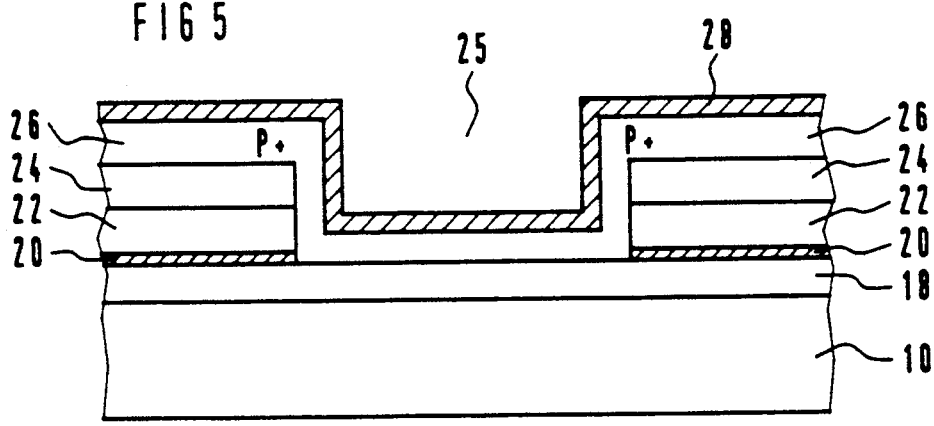
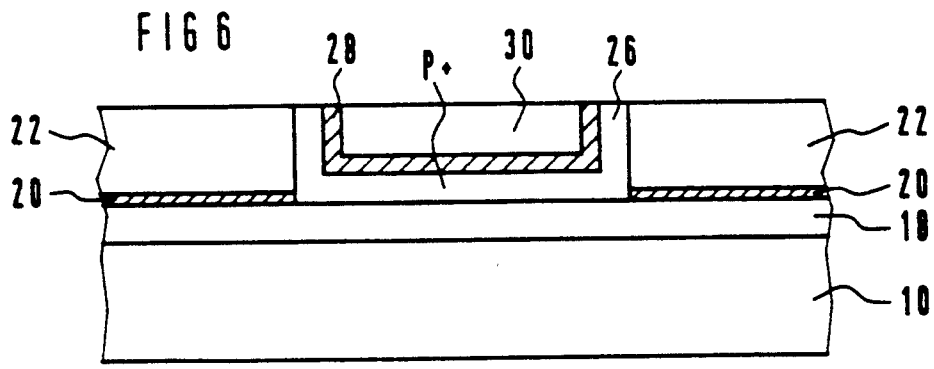

PROCESS FOR THE MANUFACTURE OF A HIGH DENSITY CELL ARRAY OF GAIN MEMORY CELLS

This invention relates to a process for the manufacture of gain memory cells. More particularly, this invention relates to a process for manufacturing a high density cell array of gain memory cells.

BACKGROUND OF THE INVENTION

Gain memory cells are advantageous because they deliver high signal charge, which makes possible very short access times and a simple signal sensing scheme. They comprise a combination of two transistors, an access and a storage transistor, and a diode connecting the source and the gate of the storage transistor.

Gain memory cells, like other devices for integrated circuits, are subject to increasing miniaturization for VLSI and ULSI circuits, e.g., down to 0.5 micron design rules and smaller. In order to make high density, high speed circuits, the processing needed to manufacture these circuits must take into account the minimizing of "real estate" or chip area requirements of the devices, and also the utilization of conventional processing steps and equipment already employed extensively in the semiconductor industry, to minimize the costs of manufacture.

Thus a practical and inexpensive process for the manufacture of gain memory cells has been sought.

SUMMARY OF THE INVENTION

The process of the invention provides for manufacture of high density gain memory cell arrays that feature shallow trench isolation of devices using a planar process, a diode integrated into the gate of the storage transistor, an implanted $V_{DD}$ line to eliminate contact connections of the transistors to the power supply, a buried strap to connect the diode to the source region of the storage transistor and self-aligned device isolation techniques. The present process minimizes the cell area requirements of the individual gain memory cells and of the cell array and maximizes cost effectiveness of gain memory cell manufacture using self-aligned process steps and a completely planar process.

The process comprises six series of steps; firstly, defining active device regions in a semiconductor substrate, e.g., a silicon wafer, and forming a gate and gate conductor stack; secondly, forming a diode integral with the gate stack; thirdly, defining the gates and ion implanting the source and drain regions of the transistors; fourthly, implanting a $V_{DD}$ line to connect the transistors to the power supply; fifthly, forming a buried strap to connect the diode to the source region of the storage transistor; and finally restructuring the gate, passivating and planarizing the device. The process of the invention uses self-aligning techniques and conventional processing steps to provide an economical process.

BRIEF DESCRIPTION OF THE DRAWING

FIGS. 1 to 12 are cross sectional views illustrating the structures obtained after various processing steps are performed.

DETAILED DESCRIPTION OF THE INVENTION

Figure 1:
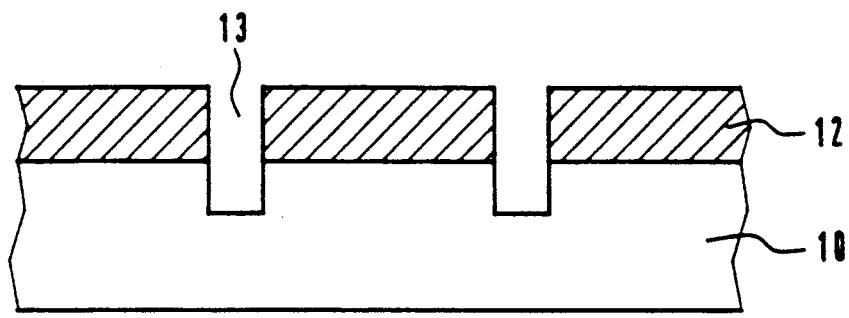

The present process provides in a first sequence of steps a planar process for defining active device regions using shallow trench isolation techniques for producing design rules in the 0.5 micron range and smaller. This isolation process includes etching to form shallow trenches, filling in the trenches with nitride and oxide depositions to isolate the device regions, and planarizing the resultant layer.

Planarizing can be achieved in any of the subsequently described planarizing steps in known manner by any kind of back etching or by using chemical mechanical polishing as disclosed by Davari et al, IEDM Techn. Dig (1989) p 89. Although illustrated by the shallow trench isolation process, active device regions can also be defined using known LOCOS techniques or channel stopper technologies. This is followed by carrying out a thermal oxide growth to form the transistor gate, and depositing polysilicon thereon as the gate conductor. A silicide layer is formed optimized to minimize sheet resistance of the wordline. The gate stack is formed by the subsequent deposition of nitride and oxide layers.

In a second sequence of steps, the diode is integrated into the gate stack. Openings are made in the gate stack for the deposition of polysilicon of a dopant type, which is opposite to the dopant type of the polysilicon of the gate conductor, siliciding the polysilicon, filling the openings with oxide and carrying out a planarizing step.

In a third sequence of steps, the first structuring of the gate conductor is carried out by RIE, and a nitride spacer is deposited. The source and drain regions of the transistors are formed by ion implantation.

In a fourth sequence of steps, an implanted $V_{DD}$ line is put down to eliminate contacts connecting the storage transistors to the power supply. A nitride layer is deposited, openings made in this layer photolithographically, ion implanting the $V_{DD}$ line and siliciding.

In a fifth sequence of steps, a buried strap is made by depositing a barrier nitride layer, depositing an oxide layer thereon, and planarizing the layers; forming openings in the oxide layer for deposition of polysilicon as the buried strap material, with a final deposition of an oxide layer and planarization thereof.

In a sixth and final sequence of steps, a second isolation is carried out, the storage gate is restructured, an oxide fill is used to passivate the device, and a final planarization is carried out.

The process will be further described with reference to the Drawing.

Figure 2:
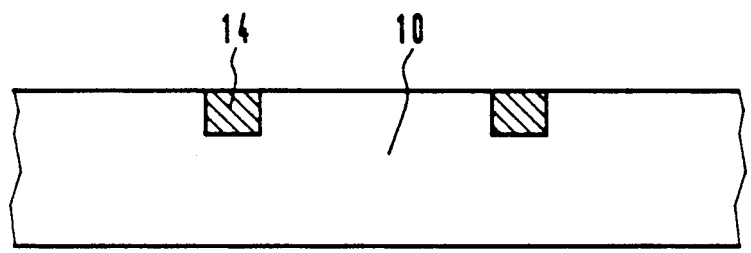

Referring now to the exemplary embodiment shown in FIG. 1, the surface of a silicon wafer 10 is cleaned in known manner to remove contaminants and particles from the surface. To form active regions using a shallow trench isolation technique, photoresist 12 is put down over the cleaned silicon wafer and patterned. The wafer is then etched to form openings 13 therein using standard photo and etch techniques. The photoresist is then removed, oxide 14 is deposited (e.g., plasma enhanced CVD oxide or sub atmospheric CVD oxide) and the surface is planarized by etching or chemical mechanical polishing and cleaned. The resultant surface is shown in FIG. 2. For a clearer understanding of succeeding process steps, FIGS. 3-12 do not detail the device isolation in the silicon wafer 10.

A silicon oxide gate layer 16 is thermally grown over the processed silicon wafer 10. For simplicity, this layer 16 is not shown on succeeding figures.

Figure 3:
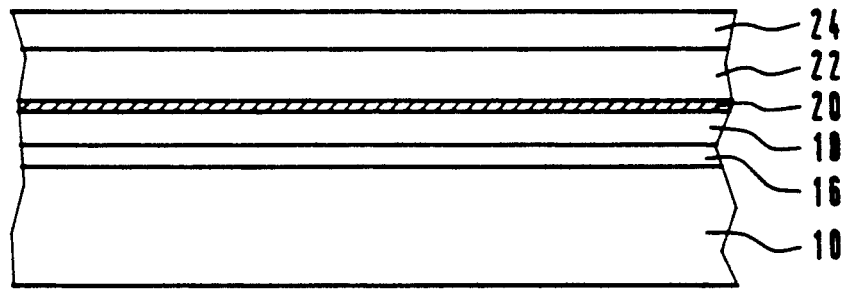

A gate stack is next formed by sequentially depositing an n-doped polysilicon layer 18, forming a silicide layer 20 thereover, and depositing a nitride layer 22 and an oxide layer 24 over the nitride layer 22. The resultant gate stack is shown in FIG. 3.

An integrated diode comprising a polysilicon layer of one dopant type covered by a polysilicon layer of opposite dopant type is formed in the gate stack by forming an opening 25 by etching through to the silicide layer 20 using photolithographic techniques as shown in FIG. 4. Thereafter a p+ doped polysilicon layer 26 is deposited in the opening. This polysilicon layer 26 can be deposited as undoped silicon followed by boron-doping by either ion implantation or diffusion techniques. The dopant concentration is chosen so that I(V) characteristics of the polysilicon diode is optimized with respect to the maximum signal charge and to short signal development time. This polysilicon deposition is followed by a siliciding step to form a second silicide layer 28. This is shown in FIG. 5.

Subsequently, an oxide layer 30 is deposited (e.g., plasma enhanced CVD oxide or sub-atmospheric CVD oxide) and then the surface of the wafer is planarized by etching or chemical mechanical polishing and cleaned. The resultant structure is shown in FIG. 6.

Figure 7:
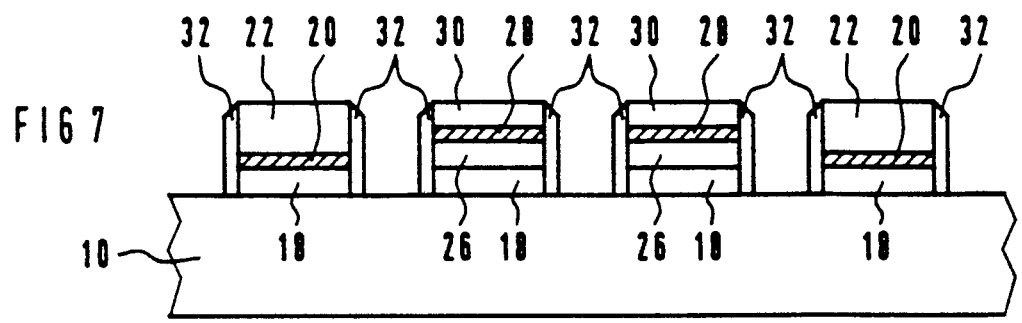

The gate stacks are now structured by photolithographically patterning the nitride layer 22 and etching through the gate stack comprising the nitride layer 22, the silicide layer 20 and the polysilicon layer 18, the gate oxide layer 16 and the diode portion comprising the filled oxide 30 over the silicide layer 28 and the polysilicon layer 26 using reactive ion etching techniques. A spacer nitride layer 32 is deposited and etched to form nitride spacers along the sides of the formed gate stack and the planarized diodes. This structure is shown in FIG. 7.

The transistor source 34 and drain 36 regions are next ion implanted into the silicon wafer 10. This ion implant is optimized to form dopant levels in the source and drain regions 34, 36 with respect to minimizing cell leakage current. The source and drain regions are thus aligned with the edges of the integrated diode regions, achieving minimum geometric size for the gain memory cells. Further, this allows processing of the diode with a non-critical structure size that is much greater than the minimum geometry size.

Figure 8:
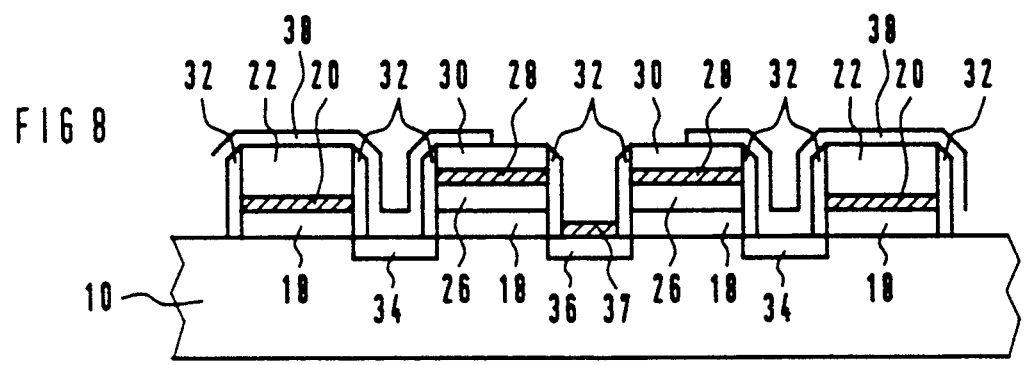
Figure 9:
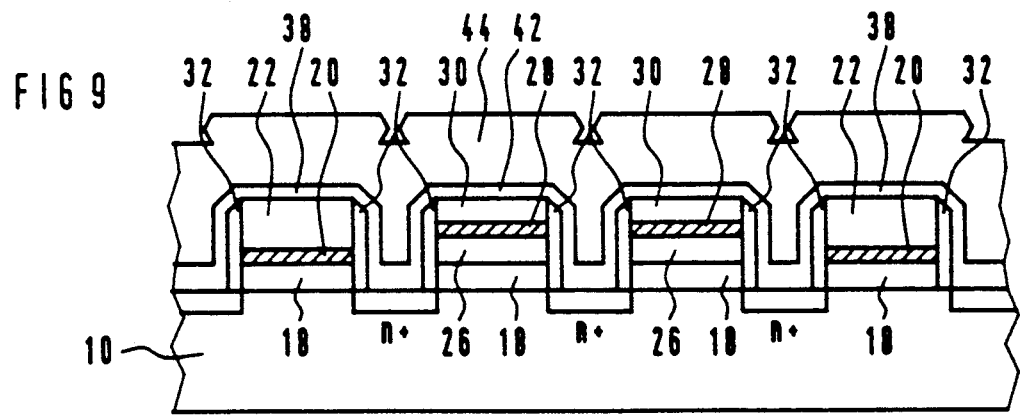

The $V_{DD}$ line is to be made next. A nitride barrier layer 38 is deposited and patterned to expose the drain region 36 and then a layer of silicide 37 is deposited over the drain region 36. This structure is shown in FIG. 8.

Additionally, the dopant concentration of the drain 36 region can be increased by ion implantation to achieve a low sheet resistance of the $V_{DD}$ line. This implanted line permits contactless connection of the drains of the storage transistors to the power supply.

Figure 10:
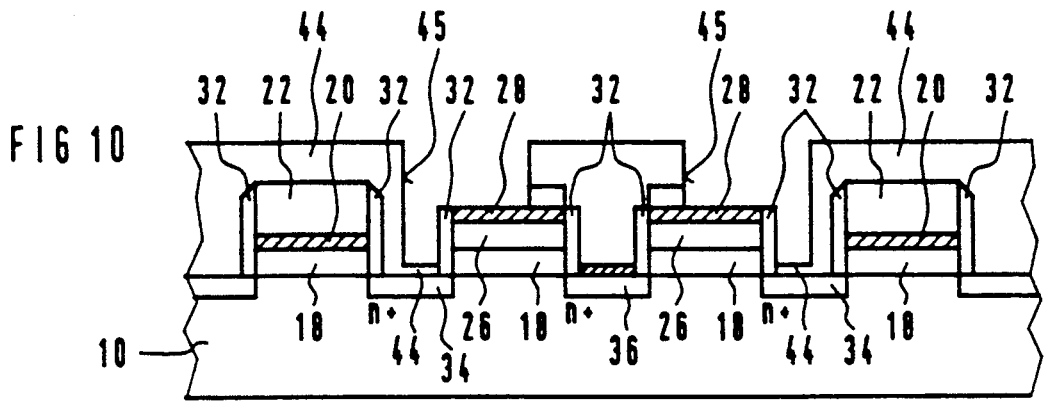

A buried strap is formed next to connect the diode to the source region of the storage transistor using a low resistive material. A barrier nitride layer 42 is deposited and then a thick oxide layer 44 deposited thereover, see FIG. 9, for planarization and definition of the buried strap using photolithography. The thick oxide layer 44 is planarized and openings 45 made therein for formation of the buried strap. This structure is shown in FIG. 10.

Figure 11:
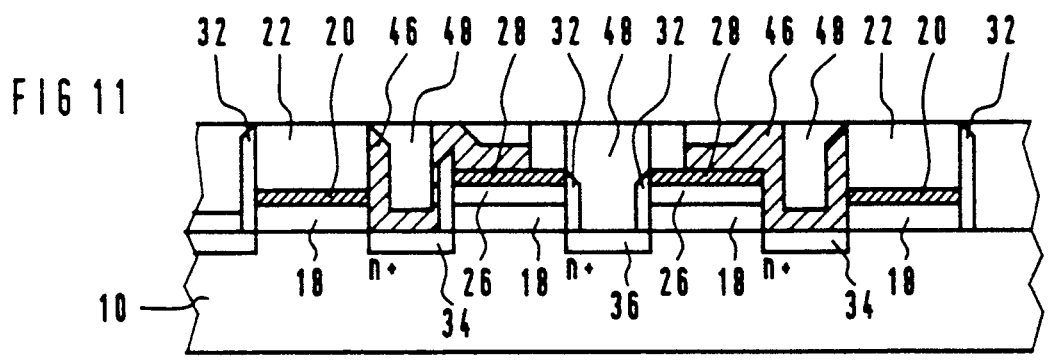

A layer of polysilicon 46 is deposited into the openings 45 which are then filled with oxide 48. The resultant structure is then planarized and is shown in FIG. 11.

The buried strap to connect the integrated diode to the source region of the storage transistor is a basic feature of the present gain memory cell. Although a particular process using polysilicon has been described for making the buried strap, it will be apparent to those skilled in the art that other processes can be used to connect the diode to the source region of the storage transistor using a low resistance material.

Figure 12:
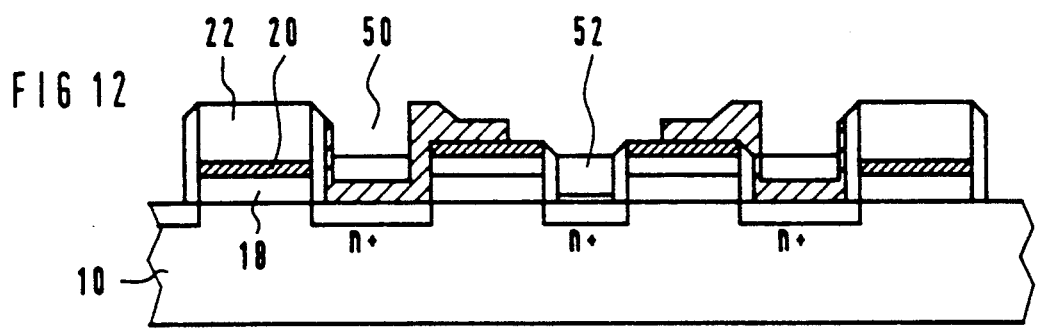

A second device isolation is carried out by selectively removing oxide except for leaving some oxide over the p-n contact regions and opening recesses 50 and 52 in the oxide layer 44. This can be done in a self-aligned manner using photolithographic patterning and selectively etching the polysilicon down to the oxide which covers the p-n junction. The final self-aligned structure is shown in FIG. 12.

The cell array is completed by structuring the storage transistor gate using a second isolation technique, e.g., a shallow trench isolation process, passivating with an oxide fill and performing a final planarization.

Although the present process has been illustrated in terms of particular embodiments and sequence of process steps, various changes can be made in the steps and their sequence without departing from the essence of the invention, and are meant to be included herein. The scope of the invention is meant only to be defined by the appended claims.

We claim:

1. A process for making an array of gain memory cells comprising an access transistor, a storage transistor and a diode, which comprises
    a) defining active device regions in a semiconductor substrate by etching a plurality of shallow trenches in said substrate, filling said trenches with a dielectric material and planarizing the surface of said substrate;
    b) forming a transistor gate stack by forming a thermal silicon oxide layer to form a transistor gate insulator and depositing a polysilicon layer thereover to form a gate conductor, forming a silicide layer thereover to minimize sheet resistance and depositing a layer of dielectric material thereover;
    c) integrating a diode into the gate stack formed in step b) by forming an opening in said gate stack, depositing polysilicon of a conductivity type opposite to that of the polysilicon gate conductor in said opening, forming a silicide layer thereover, filling said opening with silicon oxide and planarizing said opening;
    d) structuring the gate to form a plurality of gate stacks by etching through the gate stack layers to the surface of said substrate and depositing a spacer layer onto the sidewalls of the resultant gate stacks;
    e) ion implanting source and drain regions between the gate stacks formed in step d), thereby completing a plurality of transistors;
    f) forming a $V_{DD}$ line to connect the transistors formed in step e) to the power supply by depositing a nitride layer, forming openings in said nitride layer to expose the drain regions in said substrate, ion implanting through said openings and forming a silicide layer over the drain regions;
    g) forming a buried strap to connect the integrated diodes formed in step c) to the source regions of the storage transistors formed in step b) by depositing a barrier nitride layer and a first oxide layer thereover, planarizing said layers, forming openings in said first oxide and said nitride layers, depositing a low resistivity material in said openings as the buried strap material, and filling said openings with a second oxide layer;

h) restructuring the gate stacks formed in step b) by etching the oxide over a portion of the gate stacks, depositing a silicon oxide layer, passivating the resultant gain memory devices by depositing a layer of silicon oxide thereover and planarizing the resultant array of gain memory devices.

2. A process according to claim 1 wherein defining the active device regions comprises filling the trenches with silicon nitride and silicon oxide to isolate the device regions.

3. A process according to claim 1 wherein the gate conductors are formed by reactive ion etching.

4. A process according to claim 1 wherein the dielectric material of steb b) comprises layers of silicon nitride and silicon oxide.

5. A process according to claim 1 wherein the low resistivity material deposited in step g) is polysilicon.

6. A process according to claim 5 wherein the second oxide layer is planarized.

* * * * *